United States Patent
Klaassen et al.

(10) Patent No.: US 7,952,685 B2
(45) Date of Patent: May 31, 2011

(54) ILLUMINATOR FOR A LITHOGRAPHIC APPARATUS AND METHOD

(75) Inventors: Michel Fransois Hubert Klaassen, Eindhoven (NL); Hendrikus Robertus Marie Van Greevenbroek, Eindhoven (NL); Bernd Geh, Scottsdale, AZ (US); Emil Peter Schmitt-Weaver, Selkirk, NY (US)

(73) Assignees: Carl Zeiss SMT AG, Oberkochen (DE); ASML Netherlands B.V., Veldhoven (NL)

( * ) Notice: Subject to any disclaimer, the term of this patent is extended or adjusted under 35 U.S.C. 154(b) by 885 days.

(21) Appl. No.: 11/724,331

(22) Filed: Mar. 15, 2007

(65) Prior Publication Data
US 2008/0225260 A1  Sep. 18, 2008

(51) Int. Cl.
*G03B 27/72* (2006.01)
*G03B 27/42* (2006.01)

(52) U.S. Cl. ............................................ 355/71; 355/53
(58) Field of Classification Search .................... 355/71, 355/53, 67
See application file for complete search history.

(56) References Cited

U.S. PATENT DOCUMENTS

| | | | |
|---|---|---|---|
| 5,323,207 A * | 6/1994 | Ina ................................. | 355/53 |
| 7,508,493 B2 * | 3/2009 | Takeuchi et al. ................ | 355/71 |
| 2005/0225829 A1 | 10/2005 | Schenker | |
| 2005/0237509 A1 | 10/2005 | Blatchford | |
| 2006/0012769 A1 | 1/2006 | Suzuki | |
| 2006/0139590 A1 * | 6/2006 | Kunst et al. .................... | 355/53 |
| 2008/0013065 A1 * | 1/2008 | Kohl .............................. | 355/67 |

* cited by examiner

*Primary Examiner* — Peter B Kim
(74) *Attorney, Agent, or Firm* — Pillsbury Winthrop Shaw Pittman LLP (57) ABSTRACT

An illuminator for a lithographic apparatus, the illuminator including an illumination mode defining element and a plurality of polarization modifiers, the polarization modifiers being moveable into or out of partial intersection with a radiation beam having an angular and spatial distribution as governed by an illumination mode defining element.

24 Claims, 5 Drawing Sheets

ILLUMINATOR FOR A LITHOGRAPHIC APPARATUS AND METHOD

FIELD

The present invention relates to an illuminator for a lithographic apparatus and a lithographic method.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. including part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through a radiation beam in a given direction (the "scanning"-direction) while synchronously scanning the substrate parallel or anti-parallel to this direction.

Lithographic apparatus use a radiation beam to project the pattern from the patterning device onto the substrate. Properties of the radiation beam may be controlled by a lithographic apparatus. The properties may be adjusted, for example depending upon the type of pattern to be projected onto the substrate.

It is desirable to provide a novel apparatus and method which allow modification of the polarization of the radiation beam.

SUMMARY

According to an embodiment of the invention, there is provided an illuminator for a lithographic apparatus, the illuminator including an illumination mode defining element and a plurality of polarization modifiers, the polarization modifiers being moveable such that they may be moved into or out of partial intersection with a radiation beam having an angular and spatial distribution as governed by an illumination mode defining element.

According to an embodiment of the invention, there is provided a lithographic apparatus including an illuminator configured to provide a radiation beam, a support structure configured to support patterning device, the patterning device serving to impart the radiation beam with a pattern in its cross-section, a substrate table configured to hold a substrate, and a projection system configured to project the patterned radiation beam onto a target portion of the substrate, wherein the illuminator includes an illumination mode defining element and a plurality of polarization modifiers, the polarization modifiers being moveable such that they may be moved into or out of partial intersection with a radiation beam having an angular and spatial distribution governed by the illumination mode defining element.

According to an embodiment of the invention, there is provided a lithographic method including providing a substrate, providing a radiation beam, using an illumination mode defining element to modify the angular distribution of the radiation, using a plurality of polarization modifiers to modify the polarization of one or more parts of the radiation beam, the polarization modifiers being moved into and out of intersection with parts of the radiation beam as desired, using a patterning device to impart the radiation beam with a pattern in its cross-section, and projecting the patterned radiation beam onto a target portion of the substrate.

In an embodiment of the invention, there is provided a device manufacturing method including conditioning a radiation beam; modifying an angular distribution of the radiation beam using an illumination mode defining element; modifying polarization of one or more parts of the radiation beam using a plurality of polarization modifiers, the polarization modifiers moveable into and out of intersection with parts of the radiation beam; patterning the radiation beam with a pattern in its cross-section to form a patterned beam of radiation; and projecting the patterned radiation beam onto a target portion of a substrate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

A support structure holds the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

Figure 1:
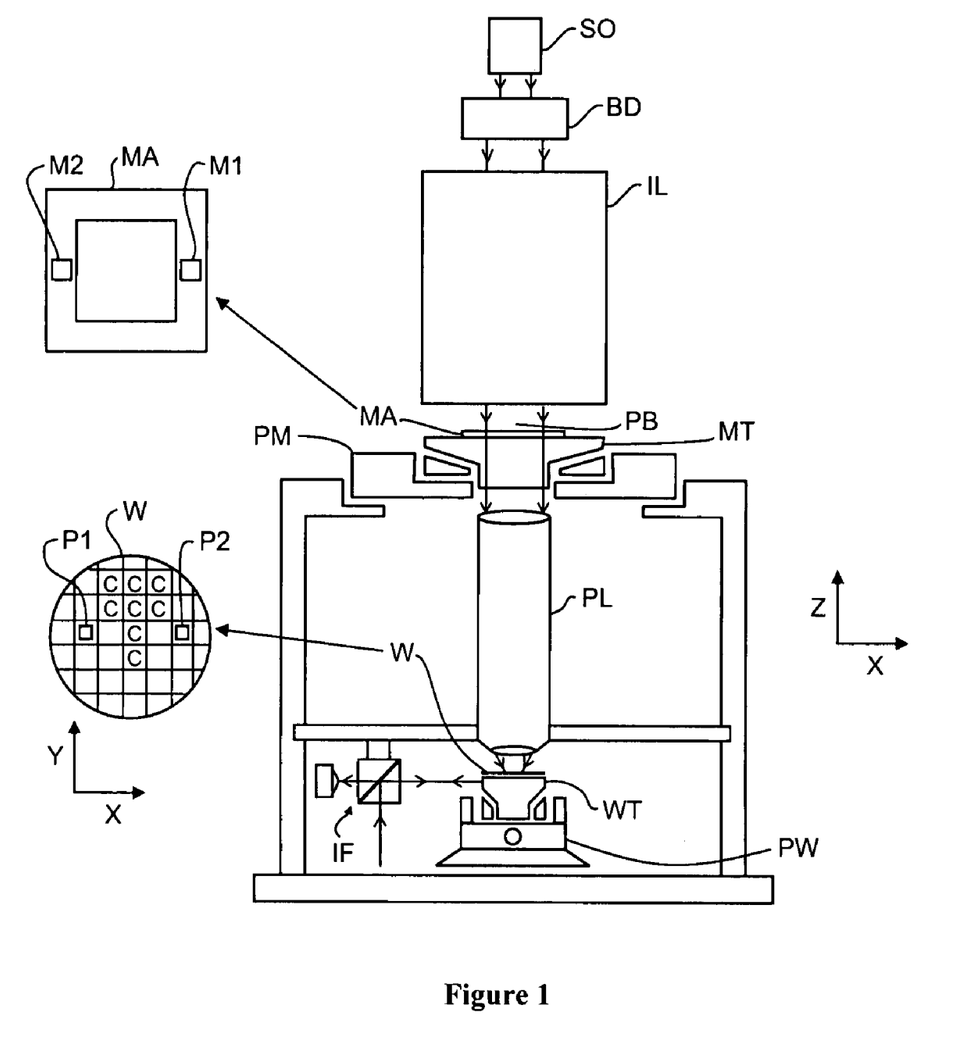
FIG. 1 depicts a lithographic apparatus according to an embodiment of the invention.

FIG. 1 schematically depicts a lithographic apparatus according to a particular embodiment of the invention. The apparatus includes an illumination system (illuminator) IL to condition a beam PB of radiation (e.g. UV radiation); a support structure (e.g. a support structure) MT to support a patterning device (e.g. a mask) MA and connected to first positioning device PM to accurately position the patterning device with respect to item PL; a substrate table (e.g. a wafer table) WT configured to hold a substrate (e.g. a resist-coated wafer) W and connected to second positioning device PW configured to accurately position the substrate with respect to item PL; and a projection system (e.g. a refractive projection lens) PL configured to image a pattern imparted to the radiation beam PB by patterning device MA onto a target portion C (e.g. including one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including for example suitable directing mirrors and/or a beam expander. In other cases the source may be an integral part of the apparatus, for example when the source is a mercury lamp. The source SO and the illuminator IL, together with the beam delivery system BD if required, may be referred to as a radiation system.

The illuminator IL may include an adjusting system configured to adjust the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally includes various other components, such as an integrator and a condenser. The illuminator provides a conditioned beam of radiation PB, having a desired uniformity and intensity distribution in its cross-section.

The radiation beam PB is incident on the patterning device (e.g. mask) MA, which is held on the support structure MT. Having traversed the patterning device MA, the radiation beam PB passes through the lens PL, which focuses the beam onto a target portion C of the substrate W. With the aid of the second positioning device PW and position sensor IF (e.g. an interferometric device), the substrate table WT can be moved accurately, e.g. so as to position different target portions C in the path of the radiation beam PB. Similarly, the first positioning device PM and another position sensor (which is not explicitly depicted in FIG. 1) can be used to accurately position the patterning device MA with respect to the path of the radiation beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The depicted apparatus can be used in the following preferred modes:

1. In step mode, the support structure MT and the substrate table WT are kept essentially stationary, while an entire pattern imparted to the radiation beam PB is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam PB is projected onto a target portion C (i.e. a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the beam PB is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
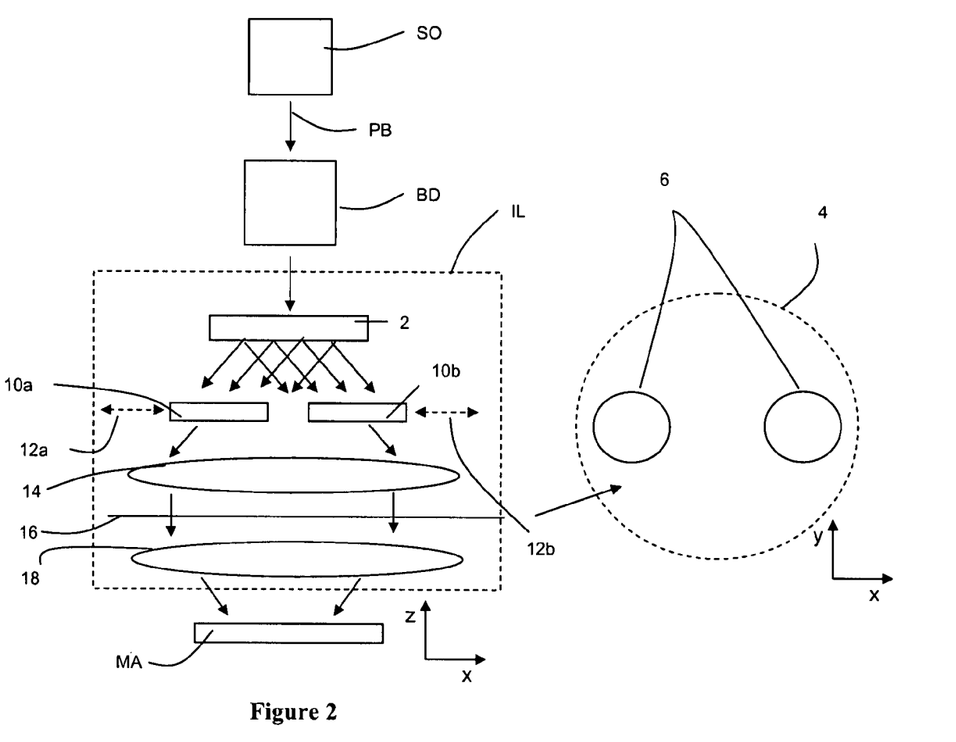
FIG. 2 is a schematic illustration of part of the lithographic apparatus of FIG. 1.

FIG. 2 shows in more detail part of the lithographic apparatus of FIG. 1. The source SO delivers a radiation beam PB to the beam delivery system BD, which in turn delivers the radiation beam to the illuminator IL. Several components of the illuminator IL are shown schematically in FIG. 2. It will be appreciated that the illuminator may include additional components (these components are omitted here in order to simplify the figure). An illumination mode defining element 2 forms part of the illuminator IL. The illumination mode defining element is arranged to apply a desired angular distribution to the radiation beam. For example, a collimated radiation beam may be converted to an angular distribution which provides a disc shape 4 in a pupil plane or to an angular distribution which provides a dipole shape 6 in a pupil plane.

The illumination mode defining element 2 may for example include an array of diffractive optical elements (possibly coupled with an array of microlenses), arranged such that a desired angular distribution is applied to the radiation beam PB. A plurality of illumination mode defining elements may be provided, such that switching between them may be used to switch between illumination modes. Switching between illumination mode defining elements may for example be achieved using a suitable automated mechanism.

The illumination mode defining element 2 may alternatively include an array of mirrors, each mirror being moveable about two rotation axes. The array of mirrors may be used to apply a desired angular distribution to the radiation beam via suitable orientation of the mirrors.

In the example illustrated in FIG. 2, the illumination mode defining element 2 converts the radiation beam PB into a dipole form 6. A proportion of the radiation beam with a given angular range passes through a polarization rotator 10a. The polarization rotator 10a may for example include a half-wave plate, a quarter wave plate, or some other form of polarization rotator. The polarization rotator 10a is translatable in a direction 12a which is transverse to the optical axis of the lithographic apparatus. The polarization rotator 10a acts to modify the polarization of the radiation which passes through it.

A proportion of the radiation beam with a different angular range passes through a different polarization rotator 10b. The polarization rotator 10b may for example include a half-wave plate, a quarter wave plate, or some other form of polarization rotator. The polarization rotator 10b is translatable in a direction 12b which is transverse to the optical axis of the lithographic apparatus. The polarization rotator 10b acts to modify the polarization of the radiation which passes through it.

A proportion of the radiation beam with a still different angular range passes between the polarization rotators 10a, 10b and does not pass through them. The polarization of this proportion of the radiation beam is therefore not modified.

The radiation beam is imaged to a pupil plane 16 by a lens system 14. The dipole mode 6 is shown schematically in FIG. 2 in the pupil plane 16. A condenser lens system 16 provides a well defined field at the field plane of the illuminator system. The patterning device (e.g. mask) MA is located in this field plane.

The polarization of the radiation incident upon the patterning device (e.g. mask) MA is modified by the operation of the polarization rotators 10a, 10b. For example, the source may generate radiation which is polarized in the x-direction (Cartesian coordinates of the lithographic apparatus are shown in FIG. 2). The polarization rotators 10a, 10b may be $\lambda/4$ plates arranged to convert linearly polarized radiation into circularly polarized radiation. The radiation which is incident upon the patterning device (e.g. mask) MA may therefore include a proportion which is circularly polarized, and a proportion which is linearly polarized in the x-direction. The radiation is not entirely circularly polarized, because not all of the radiation passed through the polarization rotators 10a, 10b.

The degree to which the radiation beam incident upon the patterning device (e.g. mask) MA is circularly polarized depends upon the positions of the polarization rotators 10a, 10b. For example, the polarization rotators may be positioned such that no part of the radiation beam passes through them. Where this is done, the radiation beam incident upon the patterning device (e.g. mask) MA is entirely x-polarized. Alternatively, the polarization rotators may be positioned such that 10% of the radiation beam passes through the first polarization rotator 10a, and 10% of the radiation beam passes through the second polarization rotator 10b. Where this is done, the radiation beam incident upon the patterning device (e.g. mask) MA is 20% circularly polarized and 80% linearly polarized. The polarization rotators 10a, 10b may be positioned in other locations, such that the radiation beam incident upon the patterning device (e.g. mask) MA has other proportions of circularly polarized radiation.

It is not essential that the polarization rotators 10a, 10b are $\lambda/4$ plates. They may for example be $\lambda/2$ plates, which in the example of FIG. 2 would rotate x-polarized radiation to y-polarized radiation.

The polarization rotators 10a, 10b are not located in a field plane or a pupil plane of the illuminator IL, but instead are located between the illumination mode defining element 2 and a pupil plane. Providing the polarization rotators 10a, 10b in this location is beneficial because it avoids introducing sharp transitions between polarization states within a given pupil area (such sharp transitions are generally unwanted). In addition it generally avoids the situation that partial insertion of the polarization modifiers causes the polarization of outer parts of the illumination mode to change while leaving the polarization of inner parts of the illumination mode unchanged. However, it may also restrict the extent to which polarization states of each pole of a dipole mode (or other mode) may be modified independently of each other.

Figure 3:
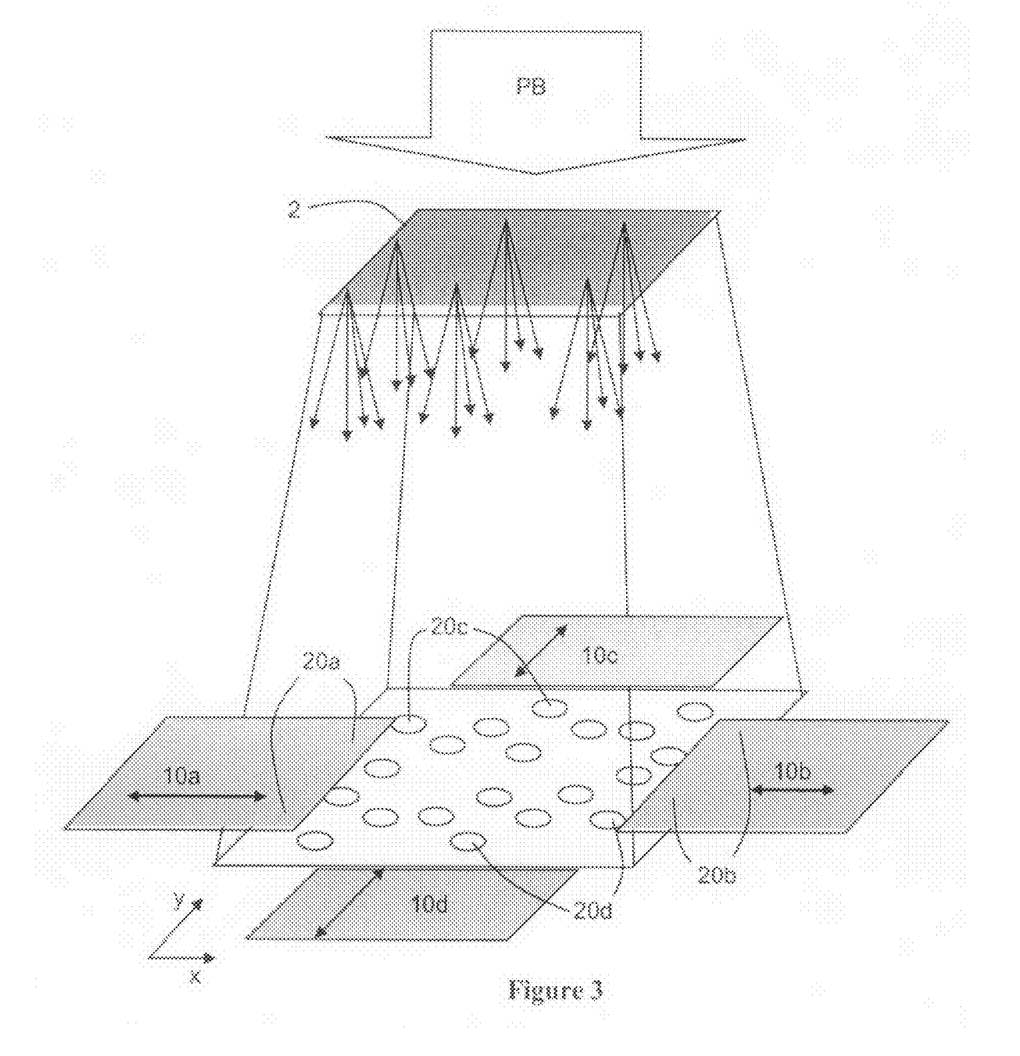
FIGS. 3 and 5 are schematic illustrations of moveable polarization adjusters which form part of the lithographic apparatus of FIG. 1.

FIG. 3 shows, in a perspective view, the polarization rotation plates 10a, 10b and two additional polarization rotation plates 10c, 10d. These additional polarization rotational plates, which are present in the lithographic apparatus, were not shown in FIG. 2 in order to keep FIG. 2 simple and thereby aid understanding of the embodiment of the invention. FIG. 2 also shows the illumination mode defining element 2 and the radiation beam PB.

As shown in FIG. 3, the effect of the illumination mode defining element 2 is to apply an angular distribution to the radiation beam such that it forms a quadrupole mode in a pupil plane. This can be seen from FIG. 3, where at each location across the illumination mode defining element, the radiation beam is converted into four parts which diverge away from one another. In the plane of the polarization rotation plates 10a-d it can be seen that divergence of the parts has taken place. However, the parts are still interspersed with one another since the polarization rotation plates 10a-d are not in the pupil plane.

It can be seen from FIG. 3 that most of the radiation beam does not pass through a polarization rotator. However, a proportion of a particular pole 20a of the quadrupole radiation passes through the first polarization rotator 10a. Similarly, a proportion of a different pole 20b of the quadrupole radiation passes through the second polarization rotator 10b. The remaining poles 20c, 20d do not pass through the polarization rotators.

The effect of the polarization rotator configuration shown in FIG. 3 is to modify a proportion of the polarization of the first and second poles of the quadrupole mode, such that the mode when incident upon the mask (not shown in FIG. 3) has a desired polarization distribution. In the case where the radiation beam PB is initially x-polarized, the first polarization rotator 10a may be used to modify the polarization of the first pole 20a of the quadrupole mode such that it is for example 20% circularly polarized. Similarly, the second polarization rotator 10b may be used to modify the polarization of the second pole of the quadrupole mode 20b such that it is also for example 20% circularly polarized.

Figure 4:
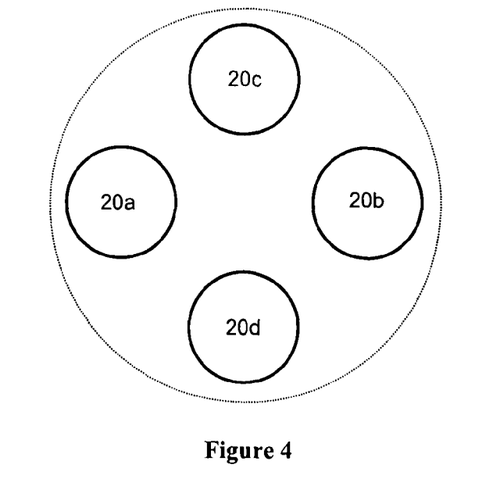
FIGS. 4 and 6a-b show schematically the effect of polarization in accordance with an embodiment of the invention.

An example of the resulting quadrupole mode is shown in FIG. 4. The first and second poles 20a, 20b are 20% circularly polarized and 80% x-polarized. The third and fourth poles 20c, 20d are x-polarized.

Each of the polarization rotators 10a-d is moveable in a direction transverse to the optical axis of the lithographic apparatus, as indicated by double headed arrows. This allows adjustment of the amount of polarization modification applied to each pole. For example, the first and second polarization rotators 10a, 10b may be moved outwards, thereby reducing the proportion of circularly polarized radiation present in the first and second poles 20a, 20b.

Since each of the polarization rotators 10a-d is independently moveable into and out of a part of the radiation beam 20a-d, this allows polarization rotation to be selectively applied to each part of the radiation beam as desired. For example, it may be desired that three poles of the radiation beam 20a-c have x-polarization, and a pole part of the radiation beam 20d is has a combination of x-polarization and circular polarization. In this case, three of the polarization rotators 10a-c are moved such that they do not intersect with the radiation beam. The polarization of the three poles 20a-c which do not pass through a polarization rotator is unchanged (i.e. these poles remain x-polarized). The polarization a proportion of the fourth pole of the radiation beam 20d is converted to circular polarization by the polarization rotator 10d, such that the fourth pole includes x-polarized radiation and circularly polarized radiation.

If the opposite polarization were to be desired, then the first three polarization rotators 10a-c are positioned such that they intersect with the first three poles of the radiation beam 20a-c, and the fourth polarization rotator 10d is positioned such that it does not intersect with the fourth pole of the radiation beam 20d.

Moving the polarization rotators 10a-d into and out of intersection with respective parts of the radiation beam 20a-d may be used to give one or more selected parts of the radiation beam 20a-d a desired balance between for example x-polarization and circular polarization. Alternatively, a balance between x and y polarization may be adjusted. Alternatively, a balance between y-polarization and circular polarization may be adjusted.

Embodiments of the invention which adjust the proportions of different types of polarization present in the radiation beam, may be used for example to control the proportions of polarizations used to project patterns onto a substrate. For example, by selectively changing the percentage of linearly polarized radiation in a single pole (beam part), the level of contrast for a given projected pattern feature may be adjusted.

Embodiments of the invention which adjust the proportions of different types of polarization may be used to match polarization states of radiation beams provided by different lithographic apparatus.

The polarization rotators 10a-d may for example be half-wave plates ($\lambda/2$), quarter-wave plates ($\lambda/4$), or some other form of polarization rotator. They may be formed from pieces of optically active material, for example crystalline quartz with its optical axis oriented in a direction parallel to the optical axis of the illuminator IL.

Although the polarization rotators 10a-d shown in FIG. 3 are rectangular, other shapes of polarization rotator may be used.

Although FIG. 3 relates to a quadrupole mode, the polarization rotators 10a-d may be used to modify the polarization of other modes. For example, they may be used to modify the polarization of a dipole mode, or a so called C-quad mode (this is similar to the quadrupole mode, each pole having curved inner and outer edges). Alternatively, the polarization rotation plates may be used to modify a mode which does not include separate radiation beam parts, but instead includes a single radiation beam with a particular shape.

In general, polarization rotators 10a-d may be moved such that they intersect with, or do not intersect with, parts of the radiation beam PB.

Two of the polarization rotators 10a, 10b may be half-wave plates, and two 10c, 10d may be quarter-wave plates. Other combinations of polarization rotators may be used.

Figure 5:
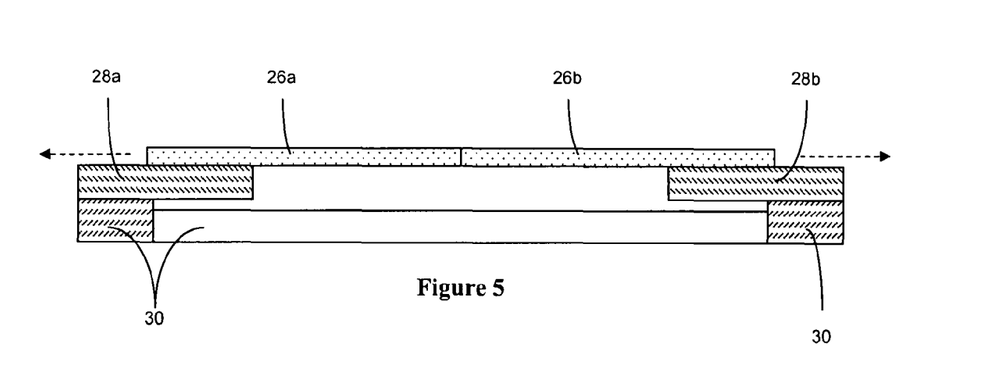

FIG. 5 shows two polarization rotators in cross-section. The polarization rotators 26a, 26b are each attached to an actuator 28a, 28b. The actuators 28a, 28b are mounted on a frame 30. The frame 30 may for example be rectangular or annular in shape, and may be arranged to support the actuators 28a, 28b without impeding the radiation beam (not shown in FIG. 5). This may be achieved by ensuring that a central open portion of the frame is sufficiently large that the radiation beam may pass through it unimpeded.

The actuators 28a, 28b may be motors. They may be for example linear electric motors or some other suitable form of motor. The actuators are arranged to move the polarization rotators 26a, 26b into and out of intersection with the radiation beam. Control of the actuators may be automated, for example controlled by a controller which may include a microprocessor. Automated control of the actuators may be coordinated with automated control of other parameters of the lithographic apparatus.

Although only two polarization rotators 10a, 10b are shown in FIGS. 2 and 5, this is for ease of illustration; typically four polarization rotators are provided. Any other number of polarization rotators may be provided. For example, two polarization rotators may be used in a simpler configuration. This may for example include two of the four polarization rotators shown in FIG. 3. Alternatively, more than four polarization rotators may be provided. For example eight polarization rotators may be provided, each polarization rotator being arranged to rotate the polarization of a different part of the radiation beam.

Although the described embodiments of the invention each relate to a single set of polarization rotators, more than one set may be provided. For example, a set of four polarization rotators which include half-wave plates may be provided, and an additional set of polarization rotators which include quarter-wave plates may also be provided. These may for example be displaced relative to one another along the optical axis of the lithographic apparatus. For example, referring to FIG. 2, a second set of polarization rotators may be provided below the first set of polarization rotators 10a, 10b.

Figure 6A:
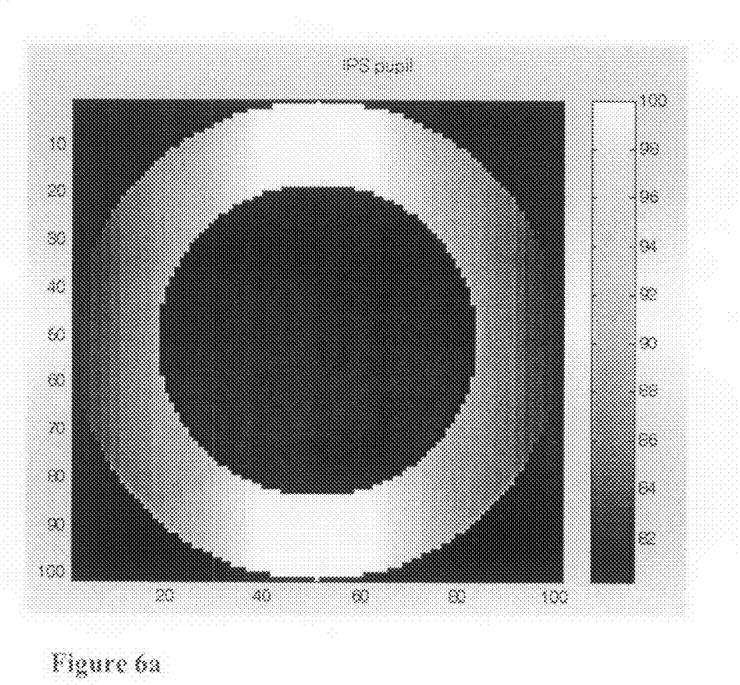
Figure 6B:
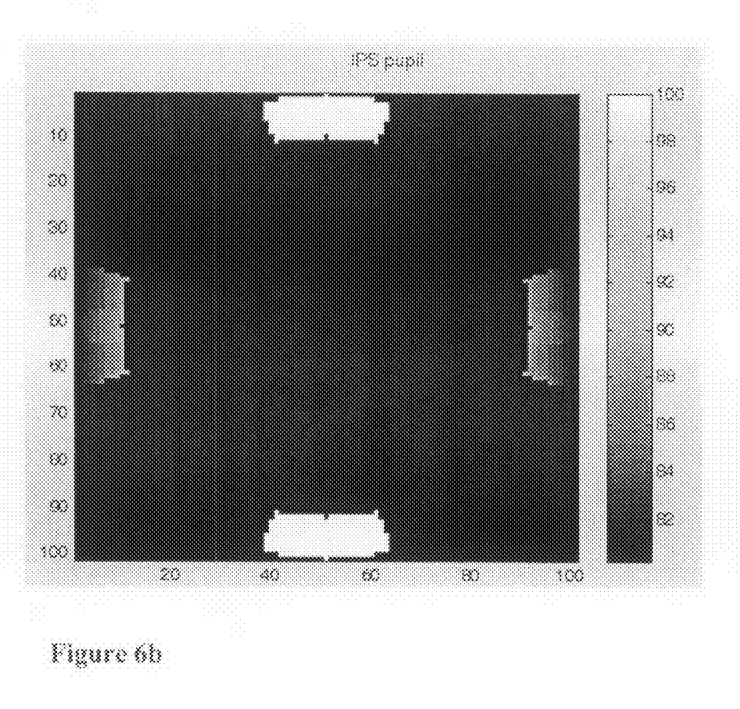

FIGS. 6a-b show, in a pupil plane, the results of a simulation of the insertion of half-wave plates into the radiation beam in the manner shown in FIG. 3. The simulation was performed for an annular illumination mode (FIG. 6a) and a C-quad illumination mode (FIG. 6b). In the simulation the illumination mode defining element has a minimum radiation angle of about 17.5 mrad and a maximum angle of about 26.5 mrad. The polarization rotators were about 200 mm away from the illumination mode defining element (measured along the optical axis). The radiation beam measured 20>20 mm (i.e. had a rectangular beam profile).

In the simulation which used the annular illumination mode, first and second polarization rotators 10a, 10b were positioned such that they overlapped with about 3.7 mm of the radiation beam. In this simulation the polarization rotators were half-wave plates ($\lambda/2$). The scale to the right hand side of FIG. 6a indicates the percentage of the radiation beam that was converted from x-polarized radiation to y-polarized radiation. It can be seen that the top and bottom of the mode was unchanged, whereas a gradual variation of the polarization is seen across the left and right hand sides of the mode.

In the simulation which used the C-quad illumination mode, first and second polarization rotators 10a, 10b were again positioned such that they overlapped with about 3.7 mm of the radiation beam. In this simulation the polarization rotators were again half-wave plates ($\lambda/2$). The scale to the right hand side of FIG. 6b indicates the percentage of the radiation beam that was converted from x-polarized radiation to y-polarized radiation. It can be seen that polarization of the top and bottom poles was unchanged, whereas the polarization of the left and right hand poles has changed considerably. A gradual variation of the polarization is seen across the left and right hand poles of the mode. The simulation indicated that, for the values given above, about a 16% change of polarization of a given pole from x-polarized radiation to y-polarized radiation could be achieved without affecting other poles.

FIG. 6 illustrates a benefit of locating the polarization rotators between the illumination mode defining element and the pupil plane, namely that gradual variation of the polarization across an illumination mode may be achieved. If the polarization rotators were to be located in the pupil plane, then they would not provide this gradual variation of the polarization.

In an alternative simulation (not illustrated) all of the polarization rotators 10a-d were positioned such that they overlapped with about 10.5 mm of the radiation beam. This converted half of the radiation beam from x-polarization to y-polarization. The resulting radiation beam therefore was 50% x-polarized and 50% y-polarized.

The simulation was used, together with a simulation of the effect of exposure of resist (Prolith 9.3) to determine the effect of modifying proportions of x and y polarized radiation on a projected pattern. In particular, the effect on the thickness of imaged lines extending in perpendicular directions was measured (this is a common measurement in lithography). It was found that the polarization rotators 10a-d were able to provide adjustment of the critical dimension of the lines by several nanometres. The polarization rotators 10a-d may therefore be used to adjust the proportions of x and y polarized radiation in a radiation beam, which in turn may be used to reduce or increase line thickness differences between imaged horizontal lines and imaged vertical lines.

Although described embodiments of the invention refer to half-wave plates or quarter-wave plates, the polarization rotators could be formed from any suitable material which rotates the polarization of the radiation beam PB. For example, the polarization rotators may include birefringent material, which may for example be configured to apply an adjustable polarization rotation to the radiation beam.

Although described embodiments of the invention refer to the polarization rotators as being located away from a pupil plane of the illuminator, they may in some instances be located in the pupil plane. Where this is done, transitions between polarization shapes will be sharp. For illumination modes which include separate poles, polarization of each poles can be controlled independently of the polarization of other poles.

Although described embodiments of the invention refer to polarization rotators, it is not essential that the polarization of the radiation beam is rotated. The polarization of the radiation beam may merely be modified in some way. Therefore, the polarization rotators may be considered to be examples polarization modifiers. Polarization modifiers, which for example may apply a polarization modification other than rotation, may be used in any of the above described embodiments of the invention. The polarization of the radiation need not necessarily be linear or circular, but could instead for example be elliptical.

The invention claimed is:

1. An illuminator for a lithographic apparatus, the illuminator comprising an illumination mode defining element and a plurality of polarization modifiers, the polarization modifiers being moveable into or out of partial intersection with a radiation beam having an angular and spatial distribution as governed by the illumination mode defining element, wherein at least one of the plurality of polarization modifiers is moveable relative to at least one other of the plurality of polarization modifiers.

2. The illuminator of claim 1, wherein the polarization modifiers are located between the illumination mode defining element and a pupil plane of the illuminator.

3. The illuminator of claim 1, wherein the polarization modifiers are located in a pupil plane of the illuminator.

4. The illuminator of claim 1, wherein the polarization modifiers are connected to actuators which are arranged to move the polarization modifiers into and out of intersection with the radiation beam.

5. The illuminator of claim 4, wherein the actuators are controlled by an automated controller.

6. The illuminator of claim 1, wherein the polarization modifiers are polarization rotators.

7. The illuminator of claim 1, wherein the polarization modifiers are half-wave plates.

8. The illuminator of claim 1, wherein the polarization modifiers are quarter-wave plates.

9. The illuminator of claim 1, wherein the polarization modifiers comprise birefringent material configured to apply a polarization adjustment to the radiation beam.

10. The illuminator of claim 1, wherein one or more sets of polarization modifiers are provided displaced from one another along the optical axis of the illuminator.

11. A lithographic apparatus comprising:
an illuminator configured to provide a radiation beam;
a support structure configured to support a patterning device, the patterning device serving to impart the radiation beam with a pattern in its cross-section;
a substrate table configured to hold a substrate; and
a projection system configured to project the patterned radiation beam onto a target portion of the substrate;
wherein the illuminator comprises an illumination mode defining element and a plurality of polarization modifiers, the polarization modifiers being moveable into or out of partial intersection with a radiation beam having an angular and spatial distribution governed by the illumination mode defining element, wherein the polarization modifiers are located between the illumination mode defining element and a pupil plane of the illuminator and at least one of the plurality of polarization modifiers is moveable relative to at least one other of the plurality of polarization modifiers.

12. A lithographic method comprising:
providing a substrate;
providing a radiation beam;
using an illumination mode defining element to modify an angular distribution of the radiation beam;
using a plurality of polarization modifiers to modify the polarization of one or more parts of the radiation beam, the polarization modifiers being moved into and out of intersection with parts of the radiation beam as desired, such that at least one of the plurality of polarization modifiers moves relative to at least one other of the plurality of polarization modifiers;
using a patterning device to impart the radiation beam with a pattern in its cross-section; and
projecting the patterned radiation beam onto a target portion of the substrate.

13. The method of claim 12, wherein a different polarization modification is applied to different parts of the radiation beam.

14. The method of claim 12, wherein a proportion of radiation having a given polarization in a given part of the radiation beam is adjusted, by adjusting the proportion of that part of the radiation beam which is intersected by one or more polarization modifiers.

15. The method of claim 14, wherein the adjustment is achieved by moving one or more polarization modifiers transverse to an optical axis of the radiation beam.

16. The method of claim 12, wherein a controller is used to move the polarization modifiers.

17. The method of claim 12, wherein the polarization of only part of the radiation beam is modified.

18. The method of claim 12, wherein the polarization modifiers are polarization rotators.

19. The method of claim 12, wherein the polarization modifiers are half-wave plates.

20. The method of claim 12, wherein the polarization modifiers are quarter-wave plates.

21. The method of claim 12, wherein the polarization modifiers are moved into and out of intersection with parts of the radiation beam at a location between the location of modification of the angular distribution of the radiation beam using the illumination mode defining element and a pupil plane of an illuminator comprising the illumination mode defining element and the polarization modifiers.

22. A device manufacturing method comprising:
conditioning a radiation beam;
modifying an angular distribution of the radiation beam using an illumination mode defining element of an illuminator;
modifying polarization of one or more parts of the radiation beam using a plurality of polarization modifiers, the polarization modifiers moveable into and out of intersection with parts of the radiation beam at a location between the location of modification of the angular distribution of the radiation beam using the illumination mode defining element and a pupil plane of the illuminator and at least one of the plurality of polarization modifiers is moveable relative to at least one other of the plurality of polarization modifiers;
patterning the radiation beam with a pattern in its cross-section to form a patterned beam of radiation; and
projecting the patterned radiation beam onto a target portion of a substrate.

23. The method of claim 22, wherein the modifying includes modifying different parts of the radiation beam with different polarizations.

24. The method of claim 22, further comprising controlling movement of the polarization modifiers.

* * * * *